(12) United States Patent
Kasten et al.

(10) Patent No.: US 6,529,005 B1
(45) Date of Patent: Mar. 4, 2003

(54) DEVICE FOR HOMOGENIZING A MAGNETIC FIELD

(75) Inventors: Arne Kasten, Karlsruhe; Michael Westphal, Offenbach, both of (DE)

(73) Assignee: Bruker Analytik GmbH, Rheinstetten (DE)

(*) Notice: Subject to any disclaimer, the term of this patent is extended or adjusted under 35 U.S.C. 154(b) by 0 days.

(21) Appl. No.: 09/570,409

(22) Filed: May 12, 2000

(30) Foreign Application Priority Data

May 18, 1999 (DE) .......................... 199 22 652

(51) Int. Cl.[7] .................................. G01V 3/00
(52) U.S. Cl. ........................ 324/320; 324/319
(58) Field of Search .............................. 324/320, 319, 324/318, 322, 300

(56) References Cited

U.S. PATENT DOCUMENTS

| | | | |
|---|---|---|---|
| 4,698,611 A | | 10/1987 | Vermilyea |
| 4,788,502 A | | 11/1988 | Keller |
| 4,974,113 A | | 11/1990 | Gabrielse |
| 5,047,720 A | * | 9/1991 | Guy .............................. 324/320 |
| 5,235,284 A | * | 8/1993 | Tahara et al. ................ 324/320 |
| 5,278,503 A | | 1/1994 | Keller |
| 5,418,462 A | * | 5/1995 | Breneman et al. ........... 324/320 |
| 5,532,597 A | * | 7/1996 | McGinley et al. ........... 324/319 |

* cited by examiner

*Primary Examiner*—Louis Arana
(74) *Attorney, Agent, or Firm*—Paul Vincent

(57) ABSTRACT

The magnetic field in the working volume of an apparatus for measuring the magnetic resonance, in particular nuclear magnetic resonance, is homogenized in that shim plates are disposed at predetermined positions about the working volume and, in sum, do not generate a field in the center of the working volume. The summed effect of the shims is preferably inductively decoupled from the coil generating the magnetic field.

17 Claims, 3 Drawing Sheets

DEVICE FOR HOMOGENIZING A MAGNETIC FIELD

This application claims Paris Convention priority of DE 199 22 652 filed May 18, 1999 the complete disclosure of which is hereby incorporated by reference.

BACKGROUND OF THE INVENTION

The invention concerns a device for homogenizing the magnetic field generated in the working volume of a magnetic resonance device by a main magnet with a superconducting short-circuited main coil, wherein the working volume is surrounded by a plurality of ferromagnetic or permanent-magnetic elements whose number, strengths and positions are selected such that they, in their entirety, largely compensate field inhomogeneities of the main magnet in the working volume.

A device of this type is e.g. disclosed in EP 0 272 411 B1.

In contrast to magnetic field homogenization by means of so-called shim coils through which correction currents flow, so-called "passive shimming" has recently become more and more established, in particular for magnets used in magnetic resonance imaging (MRI). Actively controlled shim coils are replaced with passive ferromagnetic or permanent-magnetic small plates disposed about the working volume at predetermined locations. In standard superconducting tomography magnets having a room temperature bore, rod-shaped holders are inserted into axial guides on the wall of the room temperature bore, in which a predetermined number of ferromagnetic "shim plates" are stacked and fixed at predetermined axial positions.

Although e.g. superconducting magnets for high-resolution NMR still use shim coil sets for homogenizing the field at the sample location, magnetic resonance imaging (MRI) already uses the above mentioned method of passive shimming. This method is more demanding but less expensive and, importantly, more convenient, must be executed only once, and does not require additional current or power supplies.

A superconducting short-circuited magnet coil maintains a constant magnetic flux through its bore, i.e. the superconducting current changes immediately in response to e.g. an external disturbing field in such a manner that the total flux through the coil does not change. This, however, does not generally mean that the field in the working volume remains absolutely homogeneous and constant, since the spatial field distribution of a disturbance and of the main magnetic coil do not coincide. Prior art has proposed compensating these tolerances through arrangement of the main coil geometry, with additional superconducting coils, or using control measures (U.S. Pat. Nos. 4,974,113, 4,788,502, 5,278,503).

Integration of a passive shim system of the above mentioned kind poses a further problem. The magnetic field in the working volume has been shown to drift with time, i.e. the term of zero order of the magnetic field expansion does not remain constant at the center of the working volume. This effect is explained, in general, by temperature fluctuations in the room temperature bore of the superconducting magnet system and magnetization changes in the shim plates resulting therefrom. Magnetization of ferromagnetic iron plates is oriented by the main field magnet along its axis and saturated. However, saturation magnetization depends slightly on the temperature. This is also true for permanent-magnetic shims e.g. made from NdFeB, to an even greater degree.

Although such drifts can often be tolerated in conventional imaging, this is not the case for measurements which rely on the absolute frequency. In high-resolution spectroscopy, a so-called lock system is often used in conjunction with a compensation coil to compensate for drifting. However, for more and more applications, in particular in connection with switched gradients, the lock system cannot be used for spectroscopy.

For this reason, there is a need for a device of the above mentioned kind which is insensitive to temperature fluctuations in the shim elements.

SUMMARY OF THE INVENTION

This need is fulfilled in that the number, strengths and positions of the shims are calculated such that, in their entirety, they do not generate, to a good approximation, a magnetic field in the center of the working volume.

This boundary condition can be used to define the arrangement and optimization of the shim system: only optimization solutions are accepted which meet this condition (optionally, within narrow tolerances). For a temperature drift of the shims, the so-called $B_0$ field thereby does not change and the resonance frequency in the center of the working volume remains constant (at the value without shim system) and does not drift. The shims generate the required inhomogeneous gradient fields in the working volume. In accordance with the invention, the superposition of all these gradient field contributions must be approximately zero at the center.

Within the scope of the invention, the main magnetic field can be generated in any manner, e.g. using permanent magnets, resistive or superconducting magnet coils having iron pole shoes, resistive or superconducting "air coils", or combinations thereof.

It is, however, particularly advantageous when the main field magnet comprises a superconducting short-circuited main coil. Such magnets have become largely standard in tomography systems and are used nearly exclusively in analytic NMR systems. They guarantee good homogeneity and above all stability with time, independent of the quality of the power supply.

In the present case, it is particularly advantageous to calculate the number, strengths and positions of the shims such that, to a good approximation, they, in their entirety, do not couple with the main coil. As mentioned above, a superconducting short-circuited coil "resists" any flux change. Unfortunately, when a conventional shim system drifts due to temperature fluctuations, the flux through the main coil changes, and the superconducting current will generally change leading to a field change in the center of the working volume. This can be prevented if the total flux through the main coil generated by the shim system is zero. This boundary condition can also be required and satisfied (optionally, with close tolerance) for optimization of the shim arrangement, in particular, if some or all of the shim elements are permanent magnetic shim elements, which i.e. can be disposed such that their magnetization is opposite to the field at their locations.

The object can also be achieved with superconducting short-circuited main coils in that the number, strengths and positions of the shims are calculated such that, for a change in their overall magnetic moment, the resulting change in their total magnetic field in the center of the working volume is compensated, to a good approximation, by an opposing change in the magnetic field generated by the main coil due to inductive coupling to the main coil.

Elimination of individual disturbances is not necessary. It is sufficient to compensate for the sum of all disturbances.

Due to the additional degree of freedom, the use of permanent-magnetic shims generally provides better optimization compared to iron. This option is particularly advantageous in connection with the requirement of vanishing total flux through the main coil and justifies the higher price, the more complicated handling, and the somewhat larger temperature drifts.

Clearly, the permanent magnet material must be suitable for the given strength of the main field, i.e. must have sufficient coercive field strength. NdFeB is sufficient for most tomography systems (up to approximately 2 Tesla). With the higher field strengths of analytic magnets (currently up to approximately 20 Tesla) SmCo is recommended. Both of these materials can be used together, e.g. NdFeB for "positive" contributions and SmCo for "negative" contributions. The combination of iron (positive) and a permanent magnet (negative) can also be suitable.

With conventional tomography systems or superconducting magnets of analytic NMR having a cylinder-shaped room temperature bore, the shims are preferably disposed on a substantially cylindrical surface to guarantee free access to the working volume.

With pole shoe magnets or one-sided structures, the shims can preferably be disposed substantially in one or two planes.

Compensation or elimination of the field drift is most successful if all individual shims have the same temperature. This can be improved by connecting the shims in a heat-conducting manner.

Clearly, the features mentioned above and below can be utilized not only in the combination mentioned but also in other combinations or individually, without departing from the scope of the present invention.

The arrangements in accordance with the invention can be combined with or integrated in conventional shim systems. In particular, additional conventional shim coils can be provided.

The invention is explained in more detail below with reference to the drawings.

DESCRIPTION OF THE PREFERRED EMBODIMENT

Figure 1:
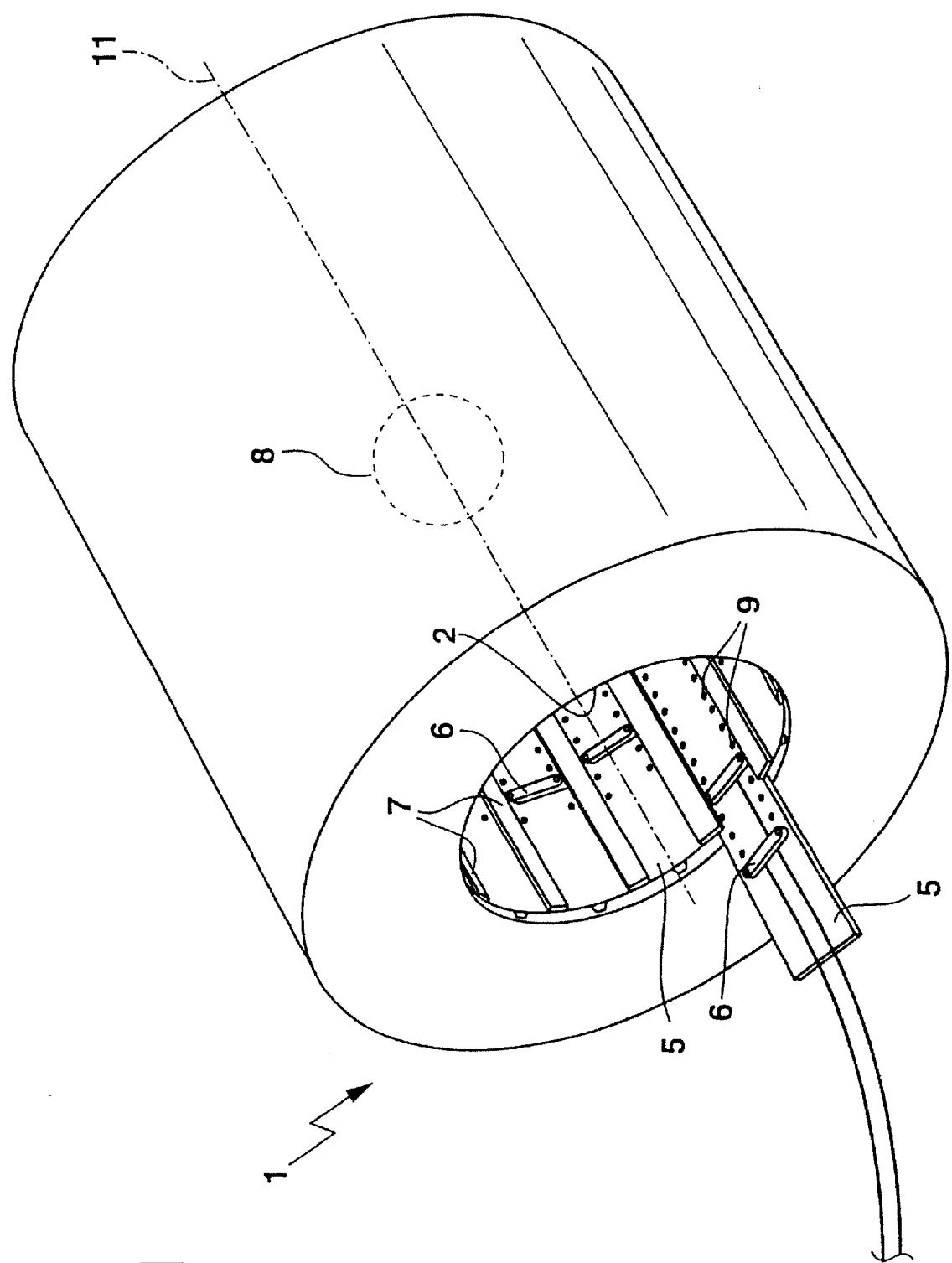
FIG. 1 is a highly schematic illustration of the main magnet of a nuclear magnetic resonance apparatus with a homogenizing means.

FIG. 1 is a highly schematic illustration of a conventional, superconducting main magnet 1 of a nuclear magnetic tomograph with an axial 11 room temperature bore 2. The working volume 8 is located in the central area of the room temperature bore 2 and would only therefore be visible in FIG. 1 in a broken open view. The inner wall of the room temperature bore 2 is provided with axial guides 7 into which holders 5 can be inserted at possible positions 9, at which shim plates 6 can be stacked. The holders 5 are inserted into the guides 7 and fixed in place. A common cylindrically-symmetrical holder can also be provided. The support plate can be part of a support tube (see FIG. 1), or be one of two essentially flat shim support plates of a pole shoe magnet. With one-sided main magnets which allow largely free access in a semi-spherical space about the working volume, only one shim support plate can be provided. Depending on the construction of the main magnet, the shim elements will be generally placed at positions about the working volume which do not or which only slightly obstruct desired free access. Configurations are therefore feasible with which the shims are not arranged in planes or on cylinders but, particularly for main magnets of complicated construction, in positions where they have little disturbing effect.

Figure 2:
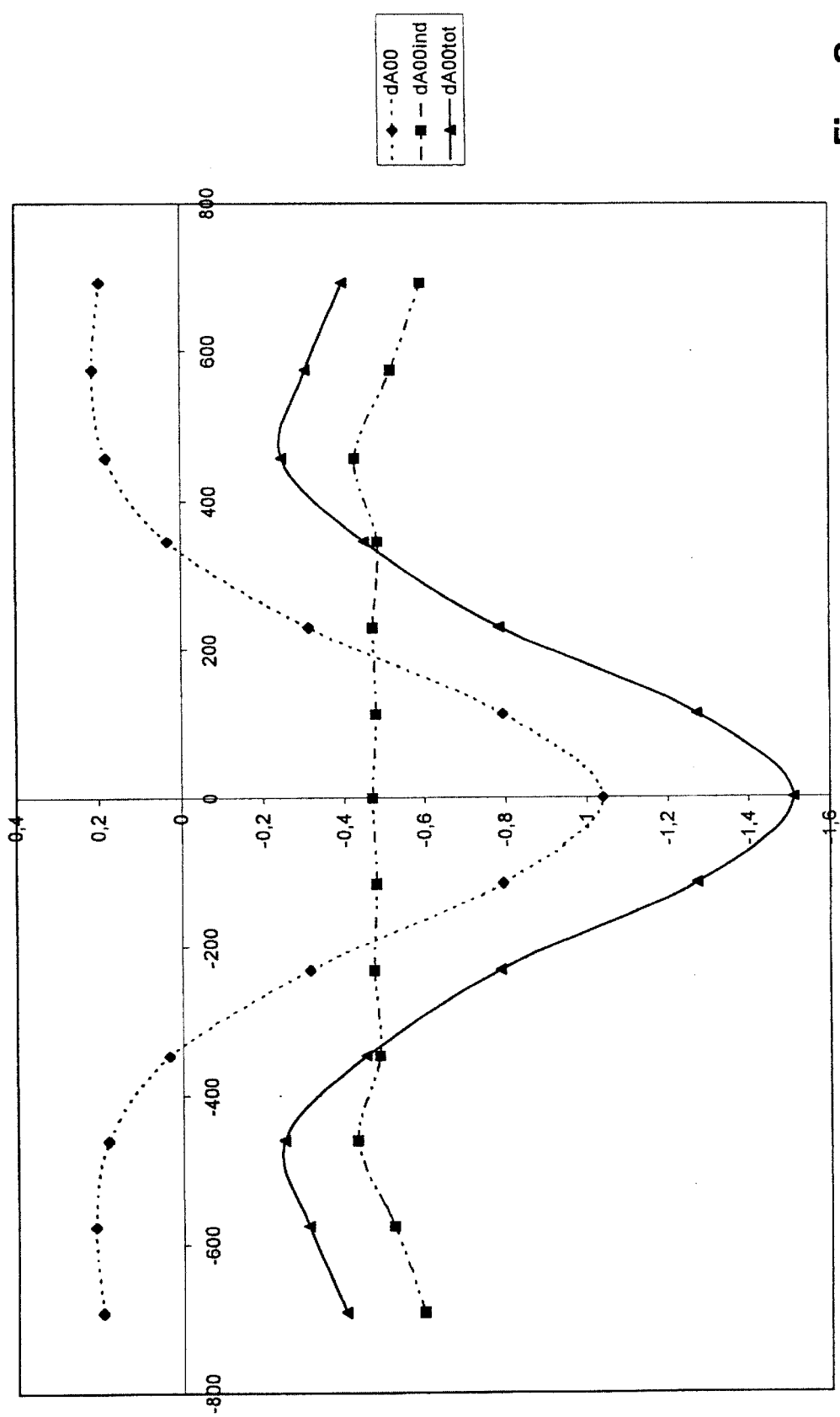
FIG. 2 shows the z-dependence of the z-component of the magnetic field of a dipole oriented at a separation from the z-axis, parallel to the z-direction.

FIG. 2 shows the z-dependence of the z-component of the magnetic field of a dipole disposed at a separation from the z-axis and directed parallel to the z-axis (separation from the axis normalized to x=1). The figure illustrates the change in the relevant field contribution at the center of the working volume of an NMR apparatus having an axial room temperature bore when a shim (approximated as a dipole) is axially displaced at the edge of said bore. One can see that at z=0 (at the center), the contribution is maximum and negative. The contribution drops, initially symmetrically, for positive and negative z-values. At an axial displacement (z), corresponding to the so-called "magic angle" (arctan(x/z)= 54°), the contribution is zero, i.e. the field lines extend perpendicular to the z direction at this location. For even larger z-values, the contribution becomes positive, rises to a maximum and finally drops asymptotically towards zero. Therefore, in principle, both negative and positive contributions to the total field ($B_z$) at the center can be generated by soft-magnetic shims (iron). It is also clear that, for a given dipole moment, the negative contributions can be larger and positive contributions can be generated only by shims disposed at large axial separations.

To achieve optimum shim results, it is therefore desirable to reverse the dipole moments, i.e. to use permanent-magnet shims.

Figure 3:
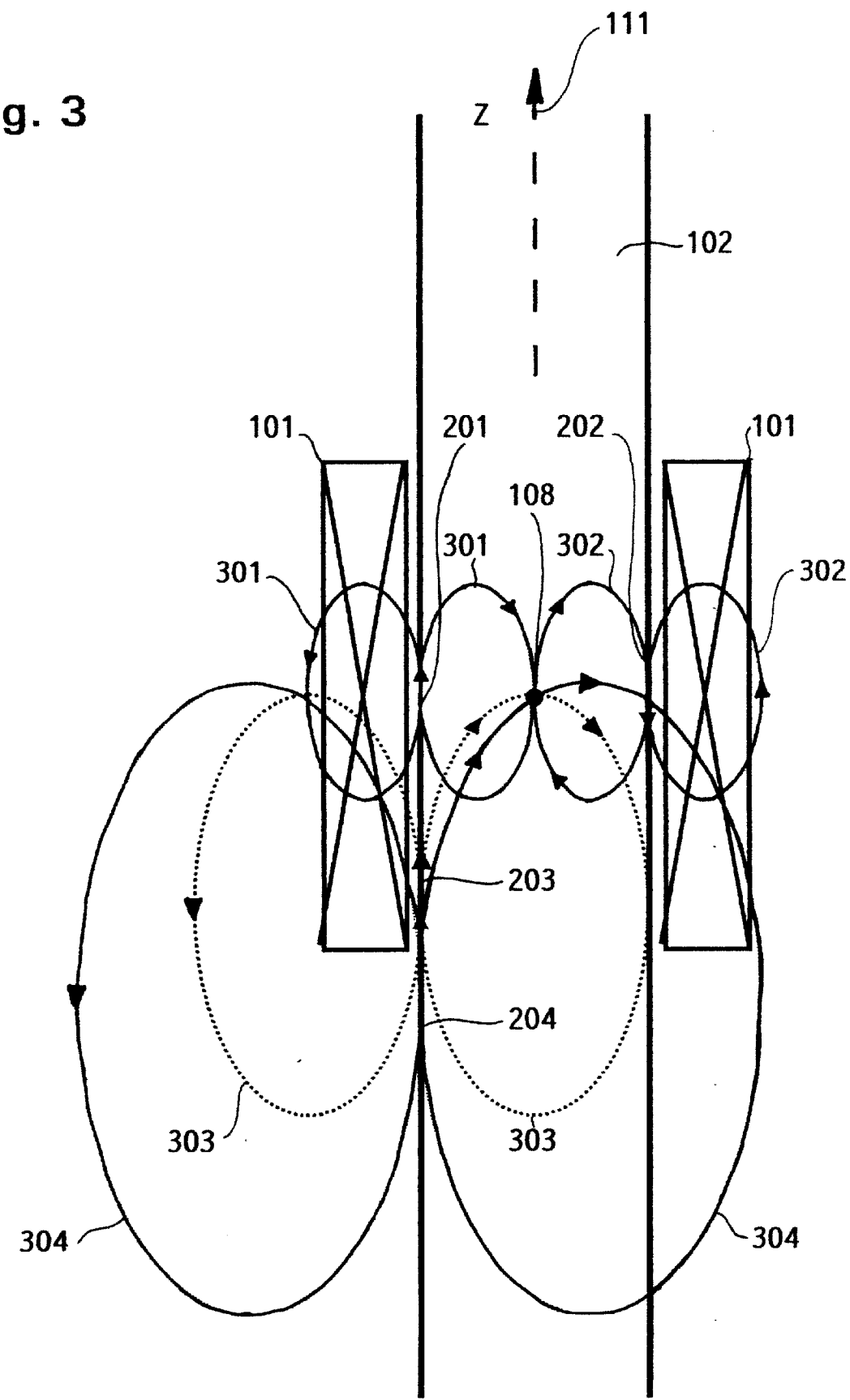
FIG. 3 schematically shows the dependence of the magnetic fields generated by shims disposed on the edge of the inner bore of a magnetic coil.

FIG. 3 is a highly schematic illustration of a main magnet coil 101 with a room temperature bore 102 along the z-axis 111. The center of the working volume is indicated by a point 108. Shims 201, 202, 203, 204 are disposed at the edge of the room temperature bore, symbolized by arrows from which magnetic field lines 301, 302, 303, 304 originate. FIG. 3 shows the local directions of the corresponding magnetic fields, in particular in the center 108. In NMR spectroscopy or imaging, to a good approximation, only the z-component of these fields is important, since they overlap with the dominating main field to form the total field in the z direction in the working volume. One sees that positive and negative contributions can be generated. The shim 202 must be a permanent magnet, whereas the others (201, 203, 204) can be soft magnets or permanent magnets, since they are oriented in the main field direction.

FIG. 3 also shows that the field lines 301, 302, 303, 304 of the shims 201, 202, 203, 204 penetrate differently through the main coil 101. The magnetic flux coupled into the main coil by the respective shims varies correspondingly.

In one embodiment, a passive shim system is optimized in a conventional manner in the working volume of a superconducting short-circuited magnetic coil having an assumed inhomogeneity.

The data of the main coil is shown in table 1.

TABLE 1

| Winding Chamber Nr. | 1 | 2 | 3 | 4 | 5 | 6 |
|---|---|---|---|---|---|---|
| $z_l/z_r$ in mm | -910.0/ -552.3 | -384.4/ -241.0 | -146.6/ -41.2 | 41.2/ 146.6 | 241.2/ 384.4 | 552.3/ 910.0 |
| $r_i/r_a$ in mm | 567.3/ 579.9 | 565.3/ 576.4 | 565.3/ 576.4 | 565.3/ 576.4 | 565.3/ 576.4 | 567.3/ 579.9 |
| Density in Windings per 100 mm² cross section | 45.208 | 45.208 | 45.208 | 45.208 | 45.208 | 45.208 |

Table 1: Geometrical parameters of a superconducting magnet coil having a cylindrical support body with 6 winding chambers. $z_l$ and $z_r$ indicate the left and right-hand coordinate, respectively, of the axial borders of the winding chambers. $r_i$ and $r_a$ indicate the inner and outer radius, respectively, of the windings in the winding chambers. With the indicated density of the windings of superconducting wire, this magnetic coil generates a homogeneous magnetic field with an induction of 1.5 Tesla at an electrical current strength of 455.3 A.

Table 2 is a list of expansion coefficients of the magnetic field about the center of the working volume in spherical harmonic functions for an assumed, realistic inhomogeneity.

Table 2: Coefficients of the field disturbances $A_{nm}$ and $B_{nm}$ of a main field magnet in accordance with table 1 in ppm for an expansion of the main field in spherical harmonic functions.

$$B(r,\theta,\phi)=\Sigma_{n=0}r^n{}_{m=0}(\Sigma P_{nm}(\cos(\theta))*(\underline{A_{nm}}*\cos(m*\phi)+\underline{B_{nm}}*\sin(m*\phi))$$

$$A_{nm}=\underline{A_{nm}}* r^n*10^6/\underline{A_{00}}$$

TABLE 2

| n | $A_{n0}$ | $A_{n1}$ | $A_{n2}$ | $A_{n3}$ | $A_{n4}$ | $A_{n5}$ | $A_{n6}$ |
|---|---|---|---|---|---|---|---|
| 1 | 25.066 | 45.9543 | .0000 | .0000 | .000000 | .000000 | .000000 |
| 2 | 218.872 | 1.1325 | -.1461 | .0000 | .000000 | .000000 | .000000 |
| 3 | -22.736 | -1.9509 | -.1847 | -.1870 | .000000 | .000000 | .000000 |
| 4 | -39.857 | 1.8081 | -.1402 | .0075 | -.002624 | .000000 | .000000 |
| 5 | 4.104 | .1393 | .0481 | .0058 | -.001233 | -.000377 | .000000 |
| 6 | 6.385 | -.5398 | .0129 | -.0034 | -.000057 | .000011 | .000026 |
| 7 | -3.405 | -.0691 | -.0068 | -.0017 | .000153 | -.000012 | .000006 |
| 8 | -2.475 | .0755 | -.0061 | .0003 | .000100 | .000004 | .000001 |
| 9 | -1.048 | .0437 | -.0024 | .0009 | .000002 | .000008 | .000000 |
| 10 | -.387 | .0139 | .0008 | .0003 | -.000032 | .000002 | -.000001 |
| 11 | .546 | -.0284 | .0023 | -.0003 | -.000020 | -.000002 | .000000 |

| n | $B_{n1}$ | $B_{n2}$ | $B_{n3}$ | $B_{n4}$ | $B_{n5}$ | $B_{n6}$ |
|---|---|---|---|---|---|---|
| 1 | 7.1588 | .0000 | .0000 | .000000 | .000000 | .000000 |
| 2 | -2.6840 | -2.4291 | .0000 | .000000 | .000000 | .000000 |
| 3 | -1.7824 | -.1023 | -.3141 | .000000 | .000000 | .000000 |
| 4 | 1.9717 | .1048 | -.0385 | -.001839 | .000000 | .000000 |
| 5 | -.0137 | -.0326 | .0089 | .000327 | -.000447 | .000000 |
| 6 | -.3897 | .0128 | .0038 | .000389 | -.000145 | .000000 |
| 7 | .0582 | .0011 | -.0004 | -.000134 | -.000012 | .000000 |
| 8 | .0586 | -.0114 | -.0002 | -.000127 | .000019 | .000000 |
| 9 | -.0943 | -.0037 | .0001 | -.000024 | .000013 | .000000 |
| 10 | -.0080 | .0034 | -.0001 | .000055 | .000002 | .000000 |
| 11 | .0128 | .0053 | -.0001 | .000034 | -.000003 | .000000 |

Analysis radius r: 22.5 cm
Central induction $A_{00}$: 1.5 T

Table 3 shows the axial and azimuthal positions of shims on a cylinder of a radius r=22.5 cm and the occupation and orientation of these positions as determined by an optimization algorithm. The field generated by uniform shims in the main coils as well as the change in the flux penetrating the main coil, as well as the total field change in the center are non-zero in each case.

|  | A | B | C | D | E | F |
|---|---|---|---|---|---|---|
| $z_0$ mm: | -690 | -575 | -460 | -345 | -230 | -115 |
| $dA_{00}/10^{-4}$T: | 0.195 | 0.212 | 0.181 | 0.033 | -0.313 | -0.793 |
| $dA_{00ind}/10^{-4}$T: | -0.594 | -0.519 | -0.429 | -0.485 | -0.473 | -0.480 |
| $dA_{00tot}/10^{-3}$T: | -0.399 | -0.307 | -0.248 | -0.452 | -0.786 | -1.273 |

Table 3: Characteristic data of a magnet shim system for homogenizing the magnetic field of a magnet coil according to table 1. 13×40 axially or azimuthally distributed positions on the surface of a cylinder of a diameter of 460 mm are provided for the shims. The 13 axial positions $z_0$ referred to as A,B, . . . M are indicated relative to the center of symmetry of the main field magnet. The 40 azimuthal positions for each axial position are numbered with integers I in tables 4 and 5 and are disposed at circumferential angles of $2\pi I/40$. Shown are the field contributions $dA_{00}$, $dA_{00ind}$ and $dA_{00tot}$ of a dipole having a strength of 105.5 Am² in the center, disposed at the different axial positions, wherein $dA_{00}$ is the direct field contribution of the dipole, $dA_{00ind}$ is the additional field contribution of the dipole caused by inductive coupling with the superconducting short-circuited main field coil according to table 1, and $dA_{00tot}$ is the sum of both contributions.

Table 4 shows the optimization result given the boundary condition that the total field change in the center must be zero. Table 5 shows an optimization result given the boundary conditions that the total field generated in the center by all the shims as well as the flux induced into the main coil are zero.

One sees that these conditions can be met without excessive effort.

With permanent-magnetic shim plates, the magnetic field must not exceed a certain limiting value at their respective positions when the plate magnetization is opposite to the magnetic field. This upper limit is related to the coercive field strength of the permanent-magnetic material at the maximum expected operating temperature. One must maintain the critical parameters safely below such upper limits at all times to prevent irreversible changes in magnetization. With conventional high field permanent magnets, such as those of the NdFeB group, the coercive field strengths are up to 4 Tesla and the admissible negative fields are approximately 3 Tesla.

In contrast to soft-magnetic shim plates which are magnetized only by the main magnet, permanent-magnetic plates should be stacked axially in the direction of the main field (and their own magnetization) since they have been (strongly) magnetized beforehand and the repulsive forces of radially stacked plates would be difficult to handle. The thin permanent-magnetic plates are usually magnetized perpendicular to their plate surface and thus attract one another when stacked.

TABLE 4

| Nr. | A | B | C | D | E | F | G | H | I | J | K | L | M |
|---|---|---|---|---|---|---|---|---|---|---|---|---|---|
| 1 | -2 | 2 | 6 | 5 | 3 | 2 | 1 | 2 | 3 | 1 | 9 | 6 | 0 |
| 2 | 0 | 2 | 5 | 6 | 2 | 1 | 0 | 1 | 3 | 1 | 9 | 5 | 1 |
| 3 | -1 | 2 | 6 | 5 | 2 | 2 | 0 | 2 | 3 | 2 | 8 | 6 | 1 |
| 4 | -1 | 2 | 5 | 5 | 2 | 1 | 1 | 1 | 4 | 1 | 9 | 6 | 1 |
| 5 | -1 | 2 | 6 | 5 | 2 | 3 | 1 | 2 | 3 | 1 | 8 | 5 | 1 |
| 6 | -2 | 2 | 5 | 5 | 2 | 2 | 0 | 2 | 4 | 0 | 8 | 6 | 0 |
| 7 | -1 | 1 | 5 | 5 | 2 | 3 | 2 | 1 | 4 | 1 | 8 | 5 | 1 |
| 8 | -1 | 2 | 5 | 5 | 3 | 2 | 1 | 2 | 3 | 2 | 7 | 5 | 1 |
| 9 | -1 | 1 | 5 | 5 | 3 | 1 | 1 | 1 | 3 | 1 | 8 | 5 | 1 |
| 10 | -1 | 2 | 5 | 5 | 3 | 2 | 0 | 1 | 4 | 2 | 8 | 5 | 0 |
| 11 | -1 | 2 | 6 | 5 | 2 | 2 | 1 | 2 | 3 | 2 | 8 | 5 | 1 |
| 12 | -1 | 2 | 5 | 5 | 1 | 3 | -1 | 1 | 3 | 1 | 7 | 6 | 1 |
| 13 | -1 | 2 | 6 | 5 | 0 | 3 | 0 | 2 | 2 | 1 | 8 | 5 | 1 |
| 14 | 0 | 2 | 6 | 4 | 0 | 3 | -1 | 1 | 3 | 1 | 8 | 6 | 1 |
| 15 | -1 | 3 | 6 | 5 | 1 | 2 | 0 | 1 | 3 | 1 | 9 | 6 | 2 |
| 16 | 0 | 2 | 5 | 4 | 1 | 1 | -1 | 1 | 2 | 1 | 8 | 6 | 1 |
| 17 | -1 | 3 | 6 | 5 | 1 | 1 | -1 | 0 | 3 | 1 | 8 | 6 | 1 |
| 18 | 0 | 2 | 5 | 4 | 2 | 1 | 0 | 0 | 3 | 1 | 9 | 6 | 2 |
| 19 | 0 | 3 | 5 | 3 | 1 | 1 | 0 | 0 | 3 | 0 | 8 | 6 | 1 |
| 20 | 0 | 2 | 5 | 3 | 2 | 1 | 0 | 0 | 3 | 0 | 8 | 7 | 2 |
| 21 | 0 | 3 | 5 | 3 | 1 | 2 | 0 | 1 | 3 | 0 | 8 | 6 | 1 |
| 22 | 0 | 2 | 5 | 3 | 1 | 2 | 0 | -1 | 4 | 1 | 9 | 6 | 2 |
| 23 | 0 | 3 | 5 | 3 | 1 | 1 | -1 | 0 | 3 | 1 | 9 | 6 | 1 |
| 24 | -1 | 3 | 5 | 3 | 1 | 1 | 0 | 0 | 3 | 1 | 9 | 7 | 2 |
| 25 | 0 | 2 | 5 | 4 | 1 | 2 | -1 | -1 | 3 | 2 | 9 | 6 | 1 |
| 26 | 0 | 2 | 5 | 3 | 2 | 1 | 0 | 1 | 3 | 2 | 9 | 6 | 1 |
| 27 | 0 | 3 | 4 | 4 | 1 | 2 | -1 | 0 | 3 | 2 | 9 | 6 | 1 |
| 28 | -1 | 2 | 5 | 4 | 1 | 2 | 0 | 0 | 4 | 2 | 10 | 6 | 1 |
| 29 | -1 | 1 | 5 | 5 | 1 | 2 | 0 | 1 | 3 | 3 | 9 | 5 | 1 |
| 30 | -1 | 2 | 5 | 6 | 2 | 2 | 0 | 1 | 4 | 2 | 9 | 6 | 0 |
| 31 | -1 | 1 | 5 | 6 | 1 | 2 | 0 | 1 | 4 | 2 | 9 | 6 | 1 |
| 32 | -1 | 1 | 4 | 6 | 2 | 3 | 1 | 1 | 3 | 2 | 9 | 5 | 0 |
| 33 | -2 | 1 | 5 | 6 | 2 | 3 | 1 | 2 | 3 | 2 | 9 | 5 | 1 |
| 34 | -1 | 1 | 4 | 6 | 2 | 3 | 0 | 2 | 3 | 2 | 9 | 6 | 0 |
| 35 | -2 | 1 | 5 | 6 | 2 | 4 | 2 | 2 | 4 | 2 | 9 | 5 | 0 |

TABLE 4-continued

| Nr. | A | B | C | D | E | F | G | H | I | J | K | L | M |
|---|---|---|---|---|---|---|---|---|---|---|---|---|---|
| 36 | -1 | 1 | 5 | 6 | 2 | 3 | 1 | 2 | 3 | 1 | 8 | 5 | 1 |
| 37 | -2 | 1 | 4 | 6 | 3 | 2 | 1 | 2 | 4 | 2 | 9 | 5 | 0 |
| 38 | -1 | 1 | 5 | 6 | 2 | 3 | 2 | 2 | 4 | 1 | 8 | 6 | 1 |
| 39 | -1 | 2 | 5 | 5 | 2 | 3 | 1 | 2 | 4 | 1 | 9 | 5 | 0 |
| 40 | -2 | 1 | 5 | 5 | 3 | 2 | 1 | 1 | 3 | 1 | 9 | 6 | 1 |

Table 4: Distribution of dipoles of a uniform strength of 1.444 Am² at the positions stated in table 3. With this distribution, the disturbing coefficients of the main field magnet $A_{nm}$ and $B_{nm}$, shown in table 2, are compensated, to a good approximation, for indices n=1,2, . . . ,8 and m=1,2, . . . 6. Moreover, the field contribution of these dipoles vanishes in the center of the magnet. The first row (A . . . M) and the first column (1 . . . 40) characterize the axial or azimuthal position of the dipoles. The other numerals represent the number of uniform dipoles at the respective position. With negative signs, the dipole is magnetized opposite to the main field direction.

TABLE 5

| Nr. | A | B | C | D | E | F | G | H | I | J | K | L | M |
|---|---|---|---|---|---|---|---|---|---|---|---|---|---|
| 1 | 0 | 0 | 1 | 4 | 0 | 0 | -1 | -1 | 1 | 0 | 4 | 4 | 2 |
| 2 | 0 | 0 | 1 | 4 | -1 | -1 | -3 | 0 | 0 | 0 | 5 | 4 | 2 |
| 3 | 0 | 0 | 2 | 4 | 0 | -1 | -2 | -1 | 1 | 0 | 5 | 4 | 2 |
| 4 | 0 | 1 | 2 | 4 | -1 | -1 | -2 | -1 | 1 | 0 | 4 | 4 | 2 |
| 5 | 1 | 0 | 1 | 4 | -1 | 0 | -1 | 0 | 1 | 0 | 4 | 3 | 2 |
| 6 | 0 | 0 | 1 | 4 | 0 | 1 | -2 | -1 | 1 | -1 | 4 | 4 | 2 |
| 7 | 0 | 0 | 1 | 4 | 0 | 0 | -1 | -1 | 1 | 0 | 4 | 4 | 2 |
| 8 | 0 | -1 | 1 | 3 | 0 | 0 | -2 | -1 | 1 | 0 | 4 | 3 | 1 |
| 9 | 0 | 0 | 1 | 4 | 0 | -1 | -1 | -1 | 0 | 1 | 3 | 3 | 2 |
| 10 | 0 | 0 | 1 | 4 | 0 | -1 | -2 | -1 | 1 | 0 | 4 | 4 | 2 |
| 11 | 0 | 0 | 2 | 4 | 0 | 0 | -2 | 0 | 0 | 1 | 4 | 3 | 2 |
| 12 | 0 | 1 | 1 | 4 | -2 | 1 | -3 | -1 | 1 | 0 | 4 | 4 | 2 |
| 13 | 1 | 0 | 2 | 3 | -2 | 1 | -2 | 0 | 0 | 0 | 3 | 4 | 3 |
| 14 | 0 | 0 | 2 | 3 | -3 | 1 | -4 | -1 | 0 | 0 | 5 | 3 | 2 |
| 15 | 1 | 1 | 2 | 4 | -2 | -1 | -3 | -2 | 0 | 0 | 4 | 5 | 2 |
| 16 | 0 | 1 | 1 | 3 | -1 | -1 | -3 | -1 | 0 | -1 | 4 | 4 | 3 |
| 17 | 1 | 0 | 2 | 3 | -1 | -1 | -3 | -3 | 0 | 0 | 4 | 4 | 2 |
| 18 | 1 | 1 | 1 | 3 | -1 | -2 | -3 | -2 | 0 | 0 | 5 | 5 | 3 |
| 19 | 1 | 1 | 1 | 2 | -1 | -1 | -2 | -2 | 0 | -1 | 4 | 4 | 3 |
| 20 | 1 | 1 | 1 | 2 | -1 | 0 | -3 | -2 | 1 | -1 | 4 | 5 | 3 |
| 21 | 1 | 0 | 1 | 2 | -2 | -1 | -2 | -2 | 1 | -1 | 4 | 4 | 2 |
| 22 | 1 | 1 | 1 | 2 | -2 | -1 | -3 | -2 | 1 | -1 | 5 | 5 | 3 |
| 23 | 1 | 1 | 1 | 2 | -1 | -1 | -3 | -3 | 1 | 0 | 5 | 4 | 2 |
| 24 | 1 | 1 | 1 | 2 | -2 | -1 | -2 | -2 | 0 | 0 | 5 | 5 | 3 |
| 25 | 1 | 1 | 0 | 2 | -1 | 0 | -3 | -3 | 1 | 1 | 5 | 4 | 2 |
| 26 | 1 | 0 | 1 | 2 | -1 | -1 | -3 | -2 | 0 | 1 | 5 | 4 | 3 |
| 27 | 1 | 1 | 1 | 3 | -2 | 0 | -3 | -2 | 0 | 0 | 5 | 5 | 2 |
| 28 | 0 | 0 | 1 | 3 | -1 | -1 | -3 | -2 | 1 | 1 | 5 | 4 | 2 |
| 29 | 1 | 0 | 1 | 4 | -2 | 0 | -2 | -1 | 1 | 1 | 6 | 4 | 2 |
| 30 | 0 | 0 | 1 | 4 | -1 | 0 | -3 | -2 | 1 | 2 | 5 | 4 | 1 |
| 31 | 0 | -1 | 0 | 5 | -1 | 0 | -2 | -1 | 1 | 1 | 5 | 3 | 2 |
| 32 | 0 | 0 | 1 | 5 | -1 | 0 | -2 | -1 | 1 | 1 | 5 | 4 | 2 |
| 33 | 0 | -1 | 1 | 5 | 0 | 1 | -2 | 0 | 0 | 1 | 5 | 4 | 1 |
| 34 | -1 | -1 | 0 | 5 | -1 | 1 | -1 | 0 | 1 | 0 | 5 | 3 | 2 |
| 35 | 0 | -1 | 1 | 5 | 0 | 1 | -2 | 0 | 1 | 1 | 5 | 4 | 1 |
| 36 | -1 | -1 | 0 | 5 | -1 | 1 | -1 | -1 | 1 | 0 | 4 | 3 | 2 |
| 37 | 0 | 0 | 1 | 4 | 0 | 1 | -1 | 0 | 1 | 0 | 5 | 4 | 1 |
| 38 | 0 | -1 | 0 | 5 | 0 | 0 | -1 | 0 | 1 | 0 | 4 | 3 | 2 |
| 39 | 0 | 0 | 1 | 4 | -1 | 1 | -1 | -1 | 1 | 0 | 5 | 4 | 2 |
| 40 | 0 | 0 | 1 | 4 | 0 | 0 | -2 | -1 | 1 | 0 | 4 | 4 | 1 |

Table 5: Distribution of dipoles of a uniform strength of 1.444 Am² at the positions shown in table 3. With this distribution, the disturbing coefficients of the main field magnet $A_{nm}$ and $B_{nm}$, shown in table 2, are compensated, to a good approximation, for the indices n=1,2, . . . 8 and m=1, 2, . . . 6. Moreover, the total field contribution of these dipoles, including the contribution of inductive coupling to a superconducting short-circuited main field coil according to table 1, vanishes in the center of the magnet. The first line (A . . . M) and the first column (1 . . . 40) give the axial and azimuthal position, respectively, of the dipoles. The other numerals indicate the number of uniform dipoles at the various positions. With a negative sign, the dipole is magnetized opposite to the main field direction.

We claim:

1. A device for homogenizing the magnetic field generated by a main magnet in a working volume of a magnetic resonance device, the working volume having a center, the device comprising:

holding means disposed about the working volume; and passive magnetic shim elements mounted in said holding means, wherein a number, strengths, and positions of said shim elements are calculated such that, in their totality, they largely compensate field inhomogeneities of the main magnet in the working volume and such that, in their totality, they generate substantially no magnetic field at the center of the working volume.

2. The device of claim 1, wherein said shim elements comprise at least one of ferromagnetic and permanent-magnetic members.

3. The device of claim 2, wherein said shim elements comprise one of soft-magnetic material and iron.

4. The device of claim 2, wherein said shim elements comprise at least one of NdFeB and SmCo.

5. The device of claim 1, wherein the main magnet comprises a main coil.

6. The device of claim 5, wherein said main coil is superconducting for operation in a superconducting short circuit.

7. The device of claim 5, wherein said number, said strengths and said positions of said shim elements are calculated such that, in sum, they are approximately decoupled from said main coil.

8. The device of claim 1, wherein said shim elements are made partly from permanent-magnetic material and partly from soft-magnetic material.

9. The device of claim 1, wherein said shim elements are disposed on a substantially cylindrical surface.

10. The device of claim 1, wherein said shim elements are disposed substantially in one of a single plane and two planes.

11. The device of claim 1, wherein said shim elements are connected in a heat-conducting fashion.

12. A device for homogenizing the magnetic field generated by a main magnet, having a super conducting main coil for operation in superconducting short-circuit, in a working volume of a magnetic resonance device, the working volume having a center, the device comprising:

holding means disposed about the working volume; and passive magnetic shim elements mounted in said holding means, wherein a number, strengths, and positions of said shim elements are calculated such that, in their totality, they largely compensate field inhomogeneities of the main magnet in the working volume and such that, for a change in their overall magnetic moment, a resulting change in an overall magnetic field generated by said shim elements in the center of the working volume is compensated, to a good approximation, by an opposing change in a magnetic field generated by the main coil due to inductive coupling to the main coil.

13. The device of claim 12, wherein said shim elements comprise at least one of ferromagnetic and permanent magnetic members.

14. The device of claim 13, wherein said shim elements comprise one of soft-magnetic material and iron.

15. The device of claim 12, wherein said shim elements are disposed on a substantially cylindrical surface.

16. The device of claim 12, wherein said shim elements are disposed substantially in one of a single plane and two planes.

17. The device of claim 12, wherein said shim elements are connected in a heat-conducting fashion.

* * * * *